US005572129A

United States Patent [19]
Carlson

[11] Patent Number: 5,572,129
[45] Date of Patent: Nov. 5, 1996

[54] RF SHIELD FOR GRADIENT COIL

[75] Inventor: Joseph W. Carlson, Kensington, Calif.

[73] Assignee: The Regents of the University of California, Berkeley, Calif.

[21] Appl. No.: 374,883

[22] Filed: Jan. 19, 1995

[51] Int. Cl.$^6$ .................................................. G01R 33/42
[52] U.S. Cl. .......................................... 324/318; 335/301
[58] Field of Search ................................... 324/318, 322, 324/300; 128/653.5; 335/301

[56] References Cited

U.S. PATENT DOCUMENTS

| | | | |
|---|---|---|---|
| 4,642,569 | 2/1987 | Hayes et al. | 324/318 |
| 4,879,515 | 11/1989 | Roemer et al. | 324/318 |
| 4,924,184 | 5/1990 | Yoda | 324/318 |
| 5,243,286 | 9/1993 | Rzedzian et al. | 324/318 |
| 5,396,173 | 3/1995 | Sakakura et al. | 324/318 |

OTHER PUBLICATIONS

Frederick & Roemer, "An RF Shield Design For NMR High-Speed & Echo Planar Imaging", Society of Magnetic Resonance—2nd Annual Meeting, San Francisco, Aug. 1994, p. 1094.

Shen, G. X., "Double-Sided Stripline RF Shield", Otsuka Electronics (U.S.A.), Inc., SMRM Berlin 1992.

*Primary Examiner*—Sandra L. O'Shea
*Assistant Examiner*—Raymond Y. Mah
*Attorney, Agent, or Firm*—Nixon & Vanderhye P.C.

[57] ABSTRACT

A RF shield for an MRI system with a cylindrical geometry is disclosed. The RF shield is a plurality of panels with polyester on one side and copper cladding on the other side. The shingles include an adhesive so the shingles can be overlapped onto each other such that half of each shingle adheres to an adjacent shingle and the other half of the shingle adheres to the inside surface of the gradient coil assembly.

15 Claims, 8 Drawing Sheets

5,572,129

RF SHIELD FOR GRADIENT COIL

FIELD OF THE INVENTION

This invention relates to Magnetic Resonance Imaging (MRI). More particularly, this invention relates to RF shields used to decouple RF coils from gradient coils in an MRI system.

BACKGROUND OF THE INVENTION

MRI systems employ static magnets which create a nominally homogeneous magnetic field in an imaging area. During the imaging procedure, gradient coils, which alter the static magnetic field by generating gradient magnetic fields in one of three orthogonal directions, rapidly switch on and off to isolate a particular section of the human body for imaging. The image information is obtained by transmitting RF signals to the human body in the imaging area to excite selected human nuclei and thereafter sensing the RF signals emitted from the nuclei as they relax from their excited state.

The gradient coils and RF transmission and reception coils are generally housed in the MRI system in close proximity to one another around the imaging area. Unfortunately, due to this proximity, the gradient coils can couple with the RF coils during RF transmission and reception, causing losses in the RF signals and corresponding reductions in the RF coil Q values. For these reasons, various shields have been devised to effectively decouple the gradient coil windings from the RF coil windings to reduce losses during RF transmission and reception and to improve RF coil Q.

One such prior RF shield for use in MRI systems with a cylindrical geometry is made with a flexible PC board having copper cladding on both sides of the board. Alternating slits in the front and back sides of the PC board divide the copper cladding on each side into a number of electrically isolated conductive panels. The electrical isolations reduce the effect of eddy currents generated in the PC board. Yet, the PC board is a contiguous conductor to RF signals since the thin substrate between the panels forms capacitors (i.e., short circuits to RF signals) between the alternating layers of conducting panels on the front and back sides of the board.

SUMMARY OF THE INVENTION

The present invention provides an improved RF shield for MRI systems in which a plurality of small flexible PC board panels are arranged like shingles around the interior surface of the cylindrical gradient coil assembly. Each of the panels according to the presently preferred embodiment require copper cladding on only one side of the flexible PC board with adhesive coating on the back of the board to allow the respective panels to adhere to their adjacent panels in the shingle arrangement.

In the presently preferred embodiment, each of the single sided panels overlaps their adjacent panel over one half of the area of the adjacent panel such that the respective panels capacitively couple to provide an RF current short circuit on the inside surface of the shield.

The present invention provides several advantages over prior art RF shields. Specifically, a requirement for only single sided panels (i.e., copper conductor on only one side) reduces expense over double sided PC boards, the smaller single sided panels of the presently preferred embodiments are less expensive and less bulky than large mechanically contiguous double sided PC boards, RF current flowing from panel-to-panel according to the presently preferred embodiments must flow through only a single capacitor between respective panels as opposed to two capacitors in prior panels, and the single sided copper cladding on every panel is accessible from the front side of the shield during testing to verify electrical isolation from one panel to the next.

These and other advantages of the invention will be more completely understood and appreciated by carefully reading the following detailed description of the presently preferred exemplary embodiment of this invention when taken in conjunction with the accompanying drawings, of which:

DETAILED DESCRIPTION OF THE PRESENTLY PREFERRED EMBODIMENTS

Figure 1:
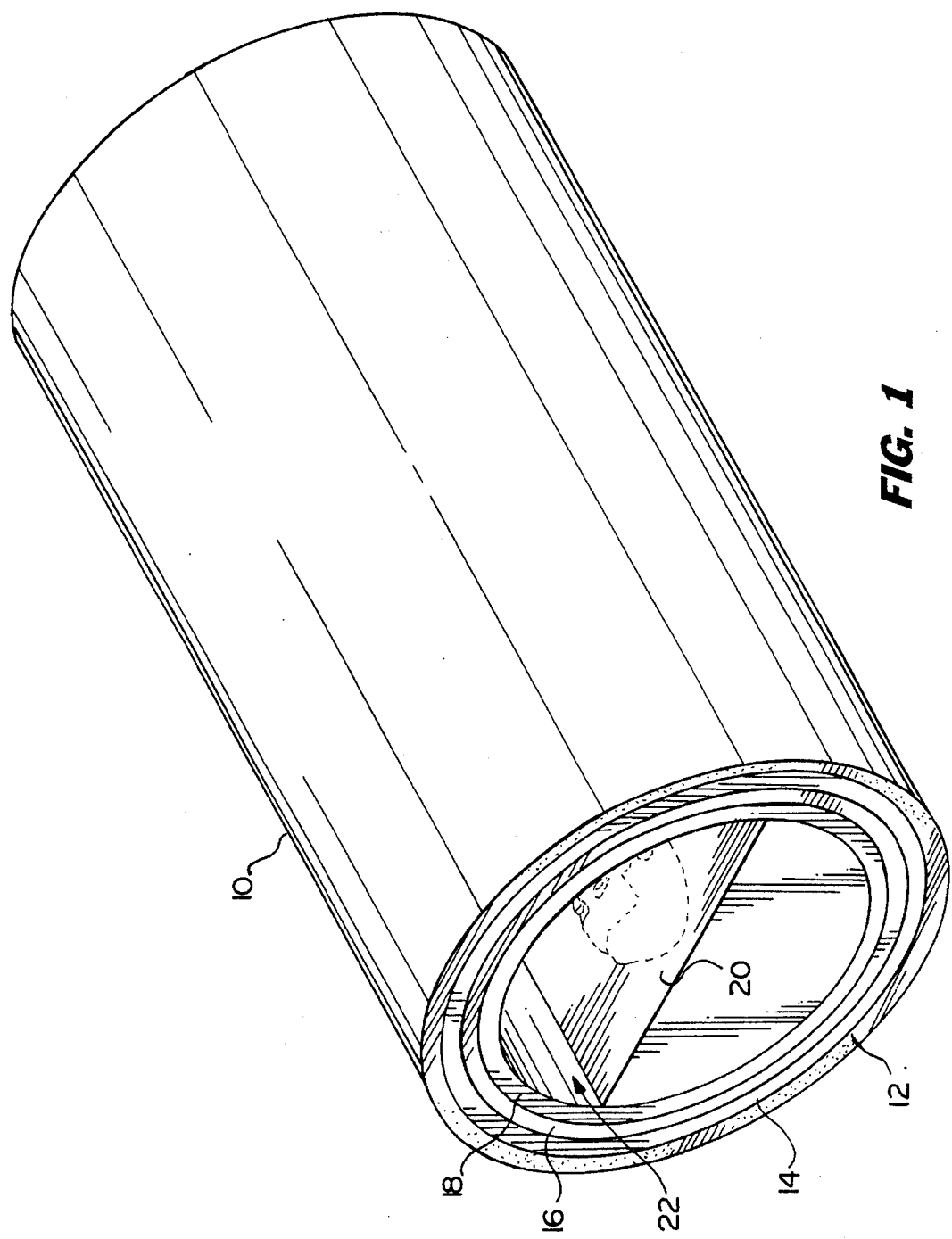
FIG. 1 is an isometric view of a MRI system with a cylindrical geometry.

The present invention is an improved RF shield for an MRI assembly. This RF shield can be particularly seen in FIG. 1 where an MRI assembly 10 includes a static magnet assembly 12, gradient coil assembly 14, RF shield 16, RF coil 18, and patient table 20. The static magnet assembly 12 provides a nominally homogeneous magnetic field in an imaging area within the bore 22 of the MRI assembly 10. A patient laying on the table 20 within the imaging area of the bore 22 is thus placed within this static homogeneous magnetic field. During the MRI operation, gradient coil assemblies 14 generate gradient magnetic fields in each of three orthogonal directions in the imaging area. The gradient magnetic fields alter the resonance frequencies at which certain human nuclei precess. This effectively spatially selects certain portions of the human body in the imaging area during the imaging process.

The spatially selected human nuclei in the imaging area are excited by a strong RF signal generated by RF coil 18. When the RF coil 18 then switches off, allowing the excited nuclei in the human body in the imaging area to relax, the excited nuclei transmit a RF signal of their own. This received signal is sensed by an RF receiving coil and is processed into an image on a video display.

The effectiveness of the RF transmissions and receptions are determined in large part by the RF coil Q values. The presence of the gradient coil assembly 14 near the RF transmission coil 18 allows the RF transmissions to couple with the wires of the gradient coil assembly 14, thereby lowering the RF coil Q and reducing the quality of the image signal. For this reason, conductive surfaces such as copper screen or cladding are used as shields 16 between the RF coil 18 and gradient coils 14. The shield 16 blocks RF transmissions generated in the imaging area from reaching the gradient coils 14. Unfortunately, large sheets of electrically contiguous material (such as copper screen or copper cladding) provide a medium for the creation of harmful eddy currents during the operation of the gradient coils 14. Specifically, during the course of the MRI procedure, the gradient coils and the gradient coil assembly 14 must rapidly switch on and off to spatially select different portions of the human body in the imaging area. A shield 16 of electrically contiguous copper (such as is needed to block the RF transmission signals from reaching the gradient coil windings) exhibits eddy currents which tend to fight the formation of gradient magnetic fields needed during the MRI procedure. As a result, the rise time of the gradient fields created by the gradient coil assembly 14 is increased, thus increasing the duration of the overall MRI operation.

A dichotomy thus exists. On the one hand, a shield 16 of electrically contiguous conductor advantageously blocks the RF signals from reaching the gradient coil windings, resulting in improved RF coil Q. On the other hand, a shield 16 of electrically contiguous conductor disadvantageously causes eddy currents to oppose the creation of the gradient magnetic fields, resulting in a longer MRI procedure.

For these reasons, the gradient coil assembly 14 and RF coil 18 are decoupled by an RF shield 16 which is electrically contiguous to RF signals but electrically isolated to eddy currents. In the past, such RF shields were made with cylindrical PC boards clad with copper on both sides. The copper was on the order of one skin depth of the RF frequency in thickness, with the thickness of the material being a trade-off between balancing RF shielding effectiveness with an increase in the rise time of the gradient field. To maintain electrical isolation to the eddy currents, the conductive copper cladding was cut into electrically isolated pieces on both sides of the PC board. While the pieces were electrically isolated, the PC board itself between the layers of coppers cladding acted as a dielectric. The copper cladding separated by PC board dielectric was a capacitor that was seen as a short circuit to RF frequency signals. This made the shield look like a solid conductor to RF signals, but an open circuit to audio frequency signals.

Figure 2:
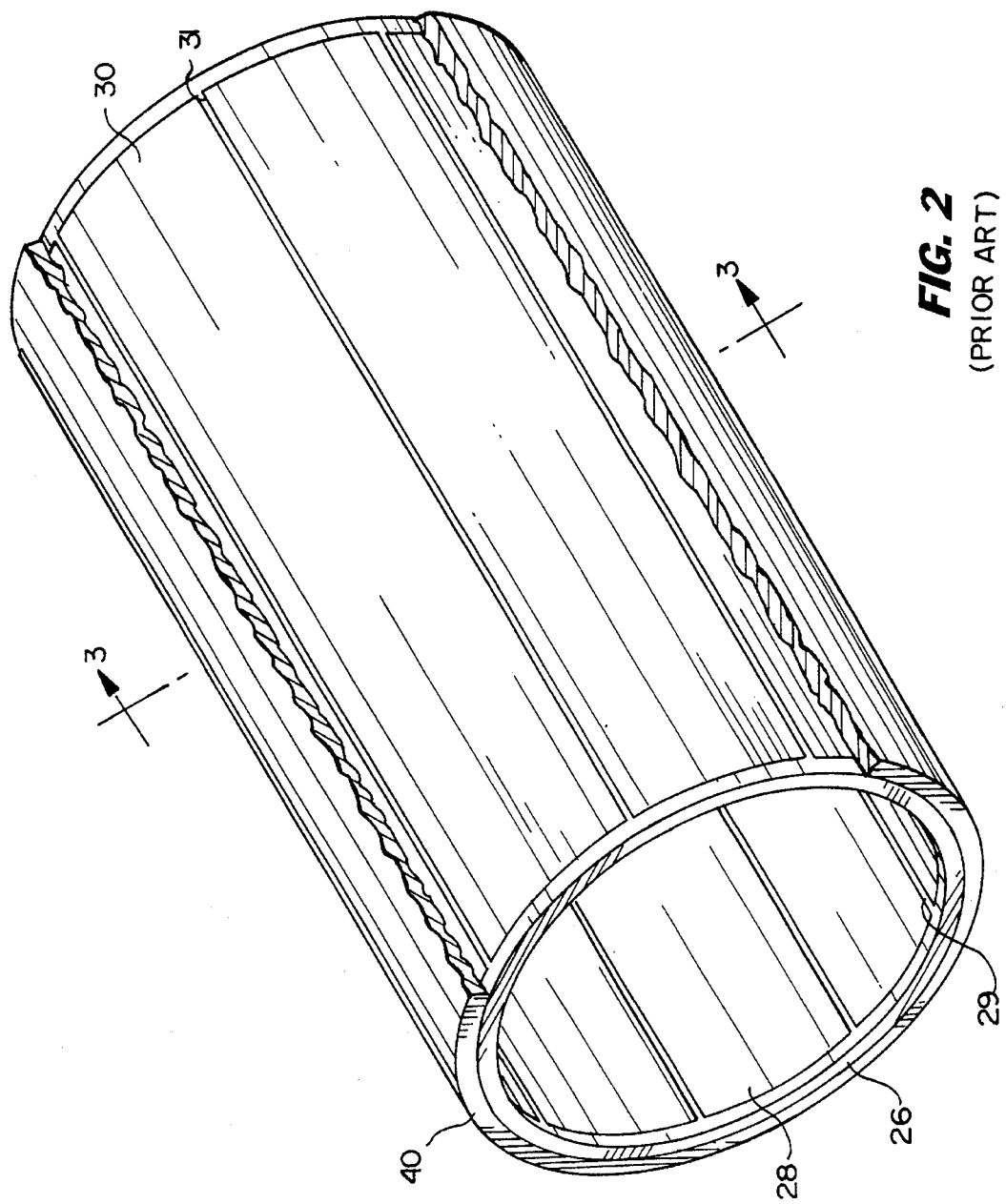
FIG. 2 is an isometric view of a prior art RF shield with a cylindrical geometry.
Figure 3:
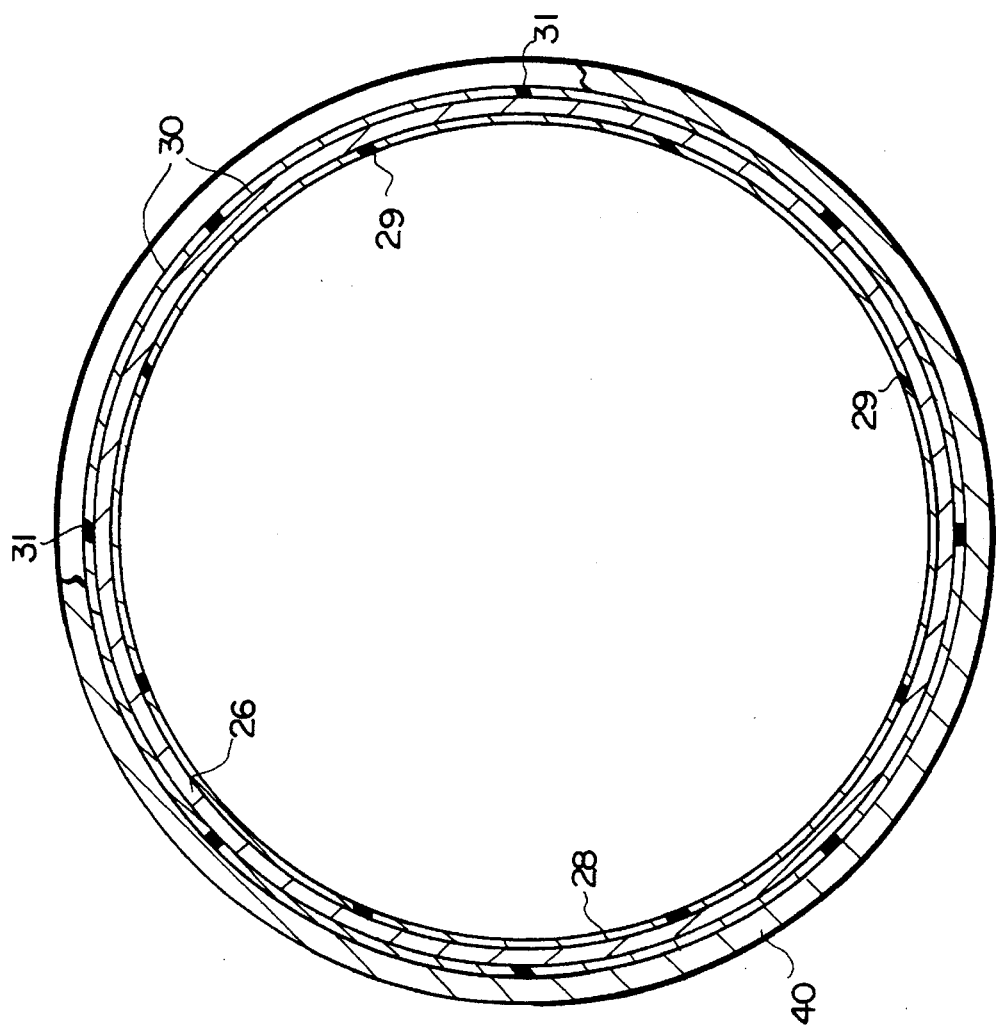
FIG. 3 is a cross-sectional view of the RF shield of FIG. 2, taken along the line 3—3.

This prior art structure is shown in FIGS. 2 and 3. In FIG. 2, a flexible PC board 26 is wrapped into a cylinder. The cylinder includes copper cladding on both the interior of the cylinder and the exterior of the cylinder, with the copper cladding being cut into a plurality of electrically isolated panels 28 (on the interior) and 30 (on the exterior) separated by cuts 29 and 31, respectively. The panels 28 and 30 are staggered around the circumference of the board 26, as is more particularly shown in FIG. 3. As shown in FIGS. 2 and 3, the board 26 with the panels 28 and 30 are attached to the interior of the gradient coil assembly 40. Since the PC board 26 is electrically insulative material, it acts as a dielectric between the staggered panels 30 and 28, respectively on the exterior and interior of the PC board 26. The electrical schematic for the prior art RF coil is shown in FIG. 4 (viewing the RF shield as the cross-section of FIG. 3).

Figure 4:
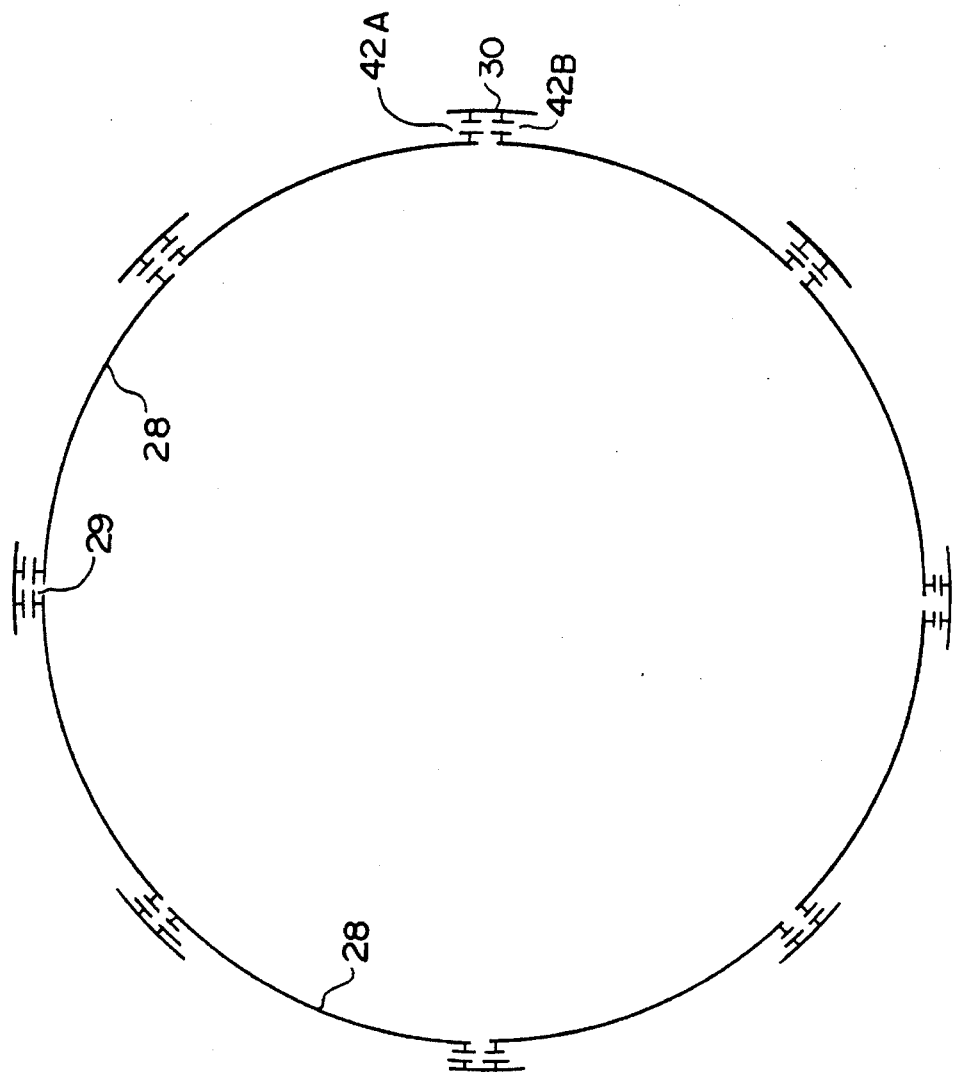
FIG. 4 is an electrical schematic of the RF shield of FIG. 3.

As can be seen in FIG. 4, RF transmissions in the imaging area (the interior of the cylinder) induce an RF current on the inside surface of the shield. The RF current travels along the conductive panels 28 on the inside surface of the PC board 26 until they reach a cut 29, where the current flows across the dielectric PC board 26 (shown in FIG. 4 as capacitor 42A) onto the conductive panel 30 on the outside surface of the PC board 26, then back onto the inside surface of the RF shield through the PC board 26 (shown as dielectric 42B). In this manner, the RF current, which sees the capacitors 42A and 42B as short circuits between the conductive panels 28 and 30, travels through the capacitors from one inside panel 28 to an adjacent panel 28 by jumping the junctions 29 through the PC board 26 and outside conductive panels 30.

Figure 5:
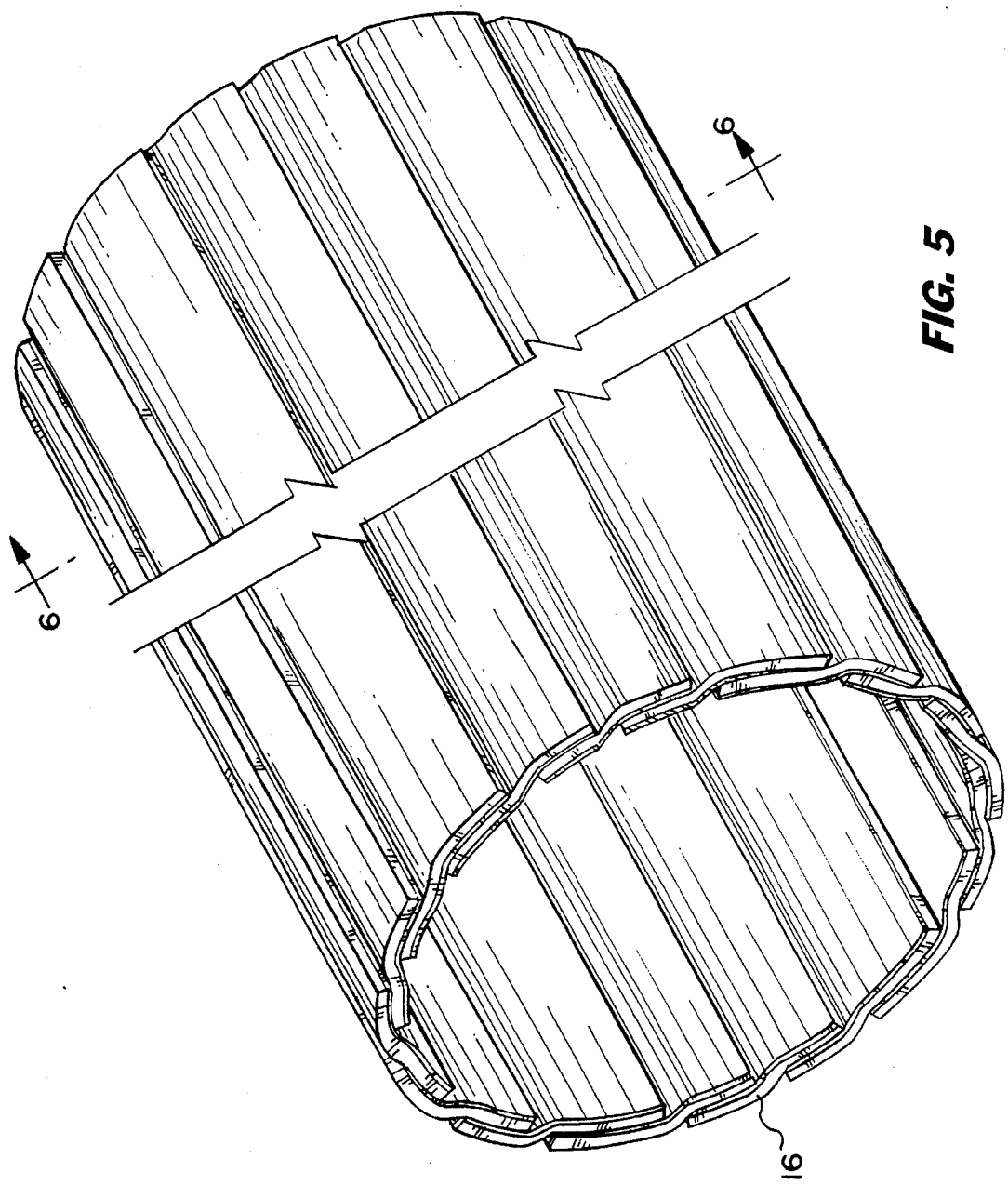
FIG. 5 is a RF shield according to the presently preferred embodiment.

In contrast to the prior art, the preferred embodiment of the present invention provides a series of sixteen overlapping smaller shingles of PC board lined on only one side with copper cladding. Each shingle extends only one eighth the circumference of the complete RF shield 16 with the 16 individual shingled panels attached to the inside surface of the gradient coil assembly 14. The isometric drawing of this preferred embodiment is shown in FIG. 5. Rather than having a single large PC board clad in copper cladding on both sides, the present invention provides manufacturing efficiencies by using smaller and single-sided panels, which are cheaper and easier to handle than full-cylinder, double sided panels required by the prior art.

Figure 6:
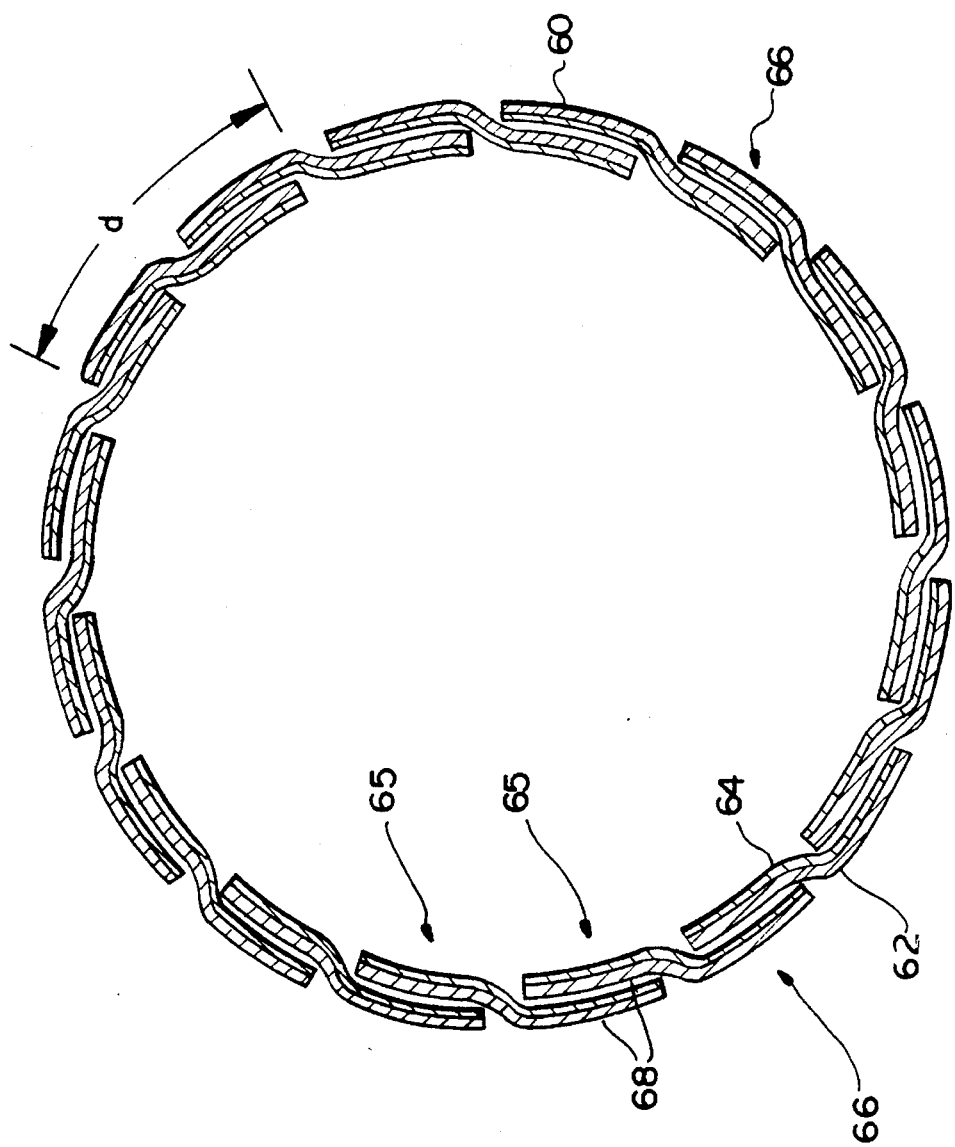
FIG. 6 is a cross-sectional view of the RF shield of FIG. 5, taken along the line 6—6, before the respective shingles are adhered to one another.

FIG. 6 shows a cross-section of FIG. 5, in which the sixteen overlapping shingles can be more particularly seen (before they are adhered to one another). Each shingle 60 includes a dielectric portion 62 (the PC board) with a copper cladding 64. In the preferred embodiment, the cladding is copper at approximately 1 mil thickness and the dielectric is polyster at approximately 5 mil thickness. The width of each shingle can be 250 cm.

The shingles 60 include a first end 65 and an opposing end 66, with each first end 65 overlapping an adjacent second end 66 of an adjacent shingle 60 by one-half the width of the shingle. Similarly, each second end 66 overlaps a first end 65 of an opposite adjacent shingle. In this manner, the shingles 60 are laid in overlapping arrangements to create the full cylindrical RF shield.

Figure 7:
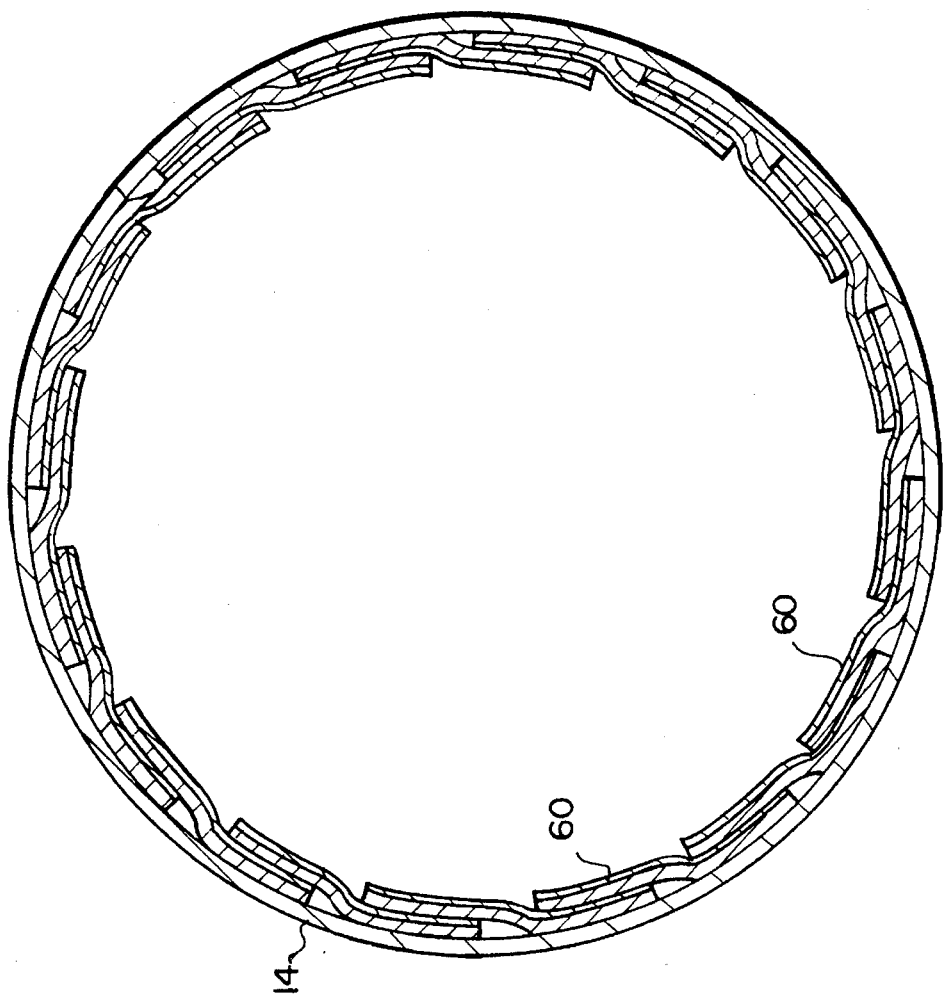
FIG. 7 is a cross-sectional view of the RF shield with the respective shingles adhered to each other and to the gradient coil assembly.

FIG. 7 shows the RF shield according to the presently preferred embodiment in its final structure with the gradient coil assembly 14. In FIG. 7, the shingles 60 are secured to one another by an adhesive 68 (FIG. 6) on the back of each of the first ends 65 of the shingles 60. The shingles 60 are also adhered to the inside surface of the gradient coil assembly 14 by adhesive 68 on the back of each of the second ends 66 of the shingles 60. The overlapping shingles 60 thus form a mechanically contiguous structure around the interior of the gradient coil assembly 14, with each of the shingles 60 electrically isolated from the adjacent shingles 60, except by capacitive coupling between the conductive cladding 64 of adjacent shingles through the PC board 62.

Figure 8:
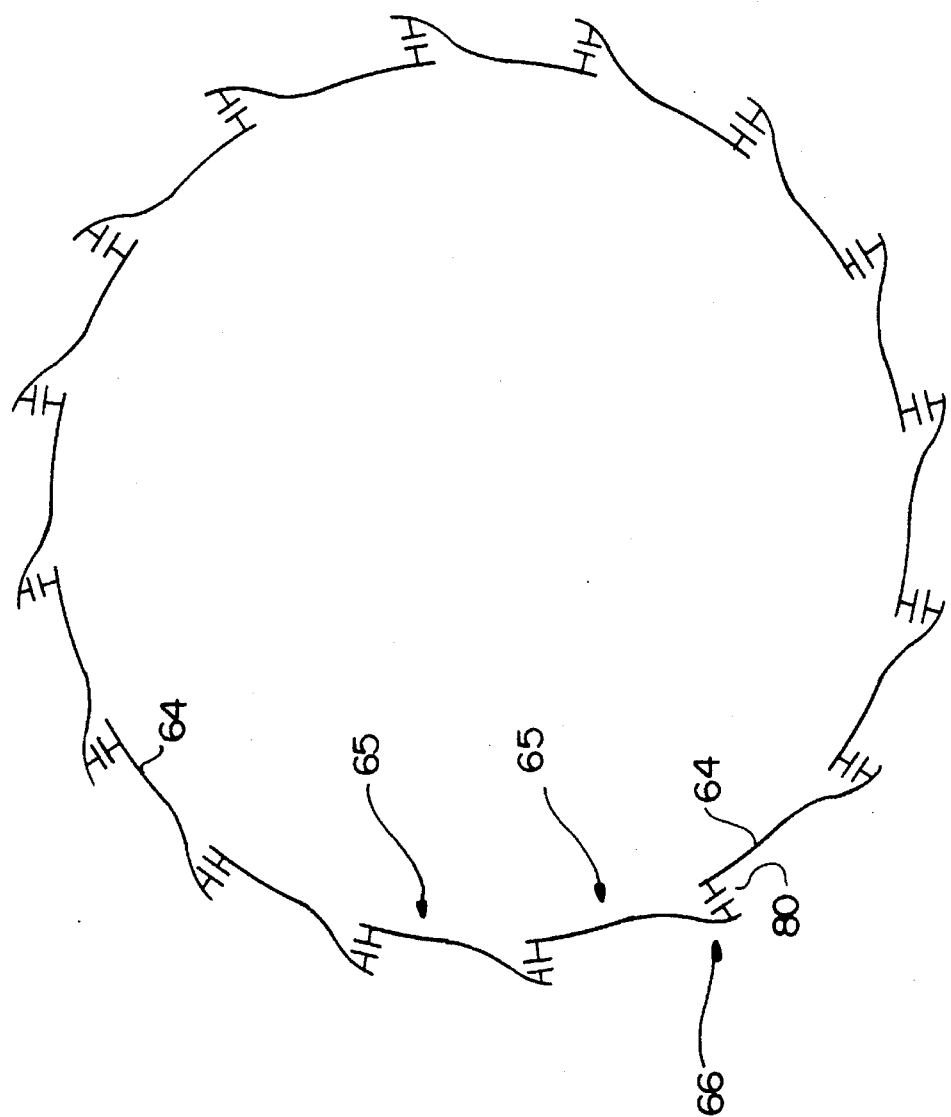
FIG. 8 is an electrical schematic of the RF shield of FIG. 7.

This capacitive coupling between adjacent shingles 60 is more particularly shown in FIG. 8. In FIG. 8, the copper cladding 64 on the first end 65 of each shingle provides a conductive path on the interior surface of the cylindrical RF shield through which RF current travelling on the inside surface of the shield passes. When the RF current reaches a junction between adjacent shingles, the RF current jumps between the copper cladding 64 on a first end 65 of the shingle 60 to the copper cladding 64 on the second end 66 of a adjacent shingle 60 through the capacitor 80 (made up of the dielectric PC board 62). In this manner, the RF current, which views the capacitor 80 as a short circuit, travels from adjacent shingle to adjacent shingle within the RF shield, but current at audio-frequencies views the adjacent shingles as electrically isolated.

As can be seen from a comparison of FIGS. 8 and 4, the present invention allows RF current to move between adjacent interior panels by jumping through only a single capacitor 80, while the prior art requires the RF current to pass through two capacitors 42A and 42B in order to cross the junction 29 between adjacent interior panels 28. The reduction in capacitors required by the present invention, effectively cuts in half the impedance seen by the RF current in passing between interior adjacent shingles.

Furthermore, a comparison of FIGS. 3 and 7 illustrate how the RF shield according to the presently preferred embodiment utilizes smaller, single-sided PC boards which are less expensive than the larger double-sided PC boards required by the prior art.

Finally, since the adjacent shingles 60 must be electrically isolated at audio frequencies, after installation, the electrical isolation of the RF shield must be tested. In the present invention, as shown in FIG. 7, electrical isolation between adjacent panels can be tested with access only to the interior surface of the RF shield, since the shingles 60 are single-sided. On the other hand, as shown in FIG. 3, to ensure electrical isolation between panels 28 and 30 (on, respectively, the interior and exterior of the cylindrical PC board), access must be gained to both the interior and exterior surfaces of the RF shield during the electrical isolation testing.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An RF shield, comprising:

a plurality of shingles,, each having a first side of laminate conductor attached to a second side of laminate insulator, the shingles overlapping such that a portion of the second side of each shingle adheres to a portion of the first side of an adjacent shingle, whereby the laminate insulator of each shingle forms a capacitor between its laminate conductor and the laminate conductor of an adjacent shingle, and the shingles overlap to form a mechanically contiguous cylinder such that no RF current path exists in the circumferential direction of the RF shield except through the plurality of shingles.

2. An RF shield as in claim 1, wherein the first and second sides of each shingle adhere to, respectively, the second side of a first adjacent shingle and the first side of a second adjacent shingle.

3. An RF shield as in claim 1, wherein the laminate conductor is copper.

4. An MRI system, comprising:

a gradient coil assembly;

an RF coil assembly; and an RF shield, connected between the gradient coil assembly and the RF coil assembly, comprising:

a plurality of shingles, each having a first side of laminate conductor attached to a second side of laminate insulator, the shingles overlapping such that a portion of the second side of each shingle adheres to a portion of the first side of an adjacent shingle, whereby the laminate insulator of each shingle forms a capacitor between its laminate conductor and the laminate conductor of an adjacent shingle, and the shingles overlap to form a mechanically contiguous cylinder such that no RF current path exists in the circumferential direction of the RF shield except through the plurality of shingles.

5. An MRI system as in claim 4, wherein the first and second sides of each shingle connect to, respectively, the second side of a first adjacent shingle and the first side of a second adjacent shingle.

6. An MRI system as in claim 4, wherein the laminate conductor is copper.

7. A method of manufacturing an RF shield, comprising the steps of:

1. providing a plurality of shingles each having a first side of laminate conductor attached to a second side of laminate insulator, 2. adhering at least a portion of the first side of a first shingle to at least a portion of the second side of a second shingle, 3. adhering at least a portion of the first side of the second shingle to the second side of a third shingle, and 4. continuing steps 2 and 3 for the remainder of the plurality of shingles until the plurality of shingles form a cylinder having a single RF current path, said path existing only through the laminate conductors and laminate insulators of said shingles.

8. An RF shield according to claim 1, wherein the only RF current path exists between laminate conductors and laminate insulators of adjacent shingles.

9. An MRI system according to claim 4, wherein the only RF current path exists between laminate conductors and laminate insulators of adjacent shingles.

10. An RF shield, comprising:

a plurality of shingles, each having a first side of laminate conductor attached to a second side of laminate insulator, the shingles overlapping such that a portion of the second side of each shingle adheres to a portion of the first side of an adjacent shingle, whereby the laminate insulator of each shingle forms a capacitor between its laminate conductor and the laminate conductor of an adjacent shingle, and the shingles overlap to form a mechanically contiguous cylinder, each shingle being electrically conductive in the axial direction of said cylinder and being electrically insulated from adjacent shingles by an approximately uniform reactance along the axial direction of each said shingle.

11. An RF shield as in claim 10, wherein the first and second sides of each shingle adhere to, respectively, the second side of a first adjacent shingle and the first side of a second adjacent shingle.

12. An RF shield as in claim 10, wherein the laminate conductor is copper.

13. An MRI system, comprising:

a gradient coil assembly;

an RF coil assembly; and an RF shield, connected between the gradient coil assembly and the RF coil assembly, comprising:

a plurality of shingles, each having a first side of laminate conductor attached to a second side of laminate insulator, the shingles overlapping such that a portion of the second side of each shingle adheres to a portion of the first side of an adjacent shingle, whereby the laminate insulator of each shingle forms a capacitor between its laminate conductor and the laminate conductor of an adjacent shingle and the shingles overlap to form a mechanically contiguous cylinder, each shingle being electrically conductive in the axial direction of said cylinder and being electrically insulated from adjacent shingles by an approximately uniform reactance along the axial direction of each said shingle.

14. An MRI system as in claim 13, wherein the first and second sides of each shingle connect to, respectively, the second side of a first adjacent shingle and the first side of a second adjacent shingle.

15. An MRI system as in claim 13, wherein the laminate conductor is copper.

* * * * *